US005563410A

United States Patent [19]

Mullock

[11] Patent Number: 5,563,410

[45] Date of Patent: Oct. 8, 1996

[54] ION GUN AND MASS SPECTROMETER EMPLOYING THE SAME

[75] Inventor: Stephen J. Mullock, Cambridge, United Kingdom

[73] Assignee: Kore Technology Limited, Cambridge, United Kingdom

[21] Appl. No.: 505,273

[22] PCT Filed: Mar. 3, 1994

[86] PCT No.: PCT/GB94/00407

§ 371 Date: Aug. 15, 1995

§ 102(e) Date: Aug. 15, 1995

[87] PCT Pub. No.: WO94/20978

PCT Pub. Date: Sep. 15, 1994

[30] Foreign Application Priority Data

Mar. 4, 1993 [GB] United Kingdom .................. 9304462

[51] Int. Cl.[6] ........................................ H01J 37/26

[52] U.S. Cl. .................... 250/288; 250/281; 250/423 R; 250/287

[58] Field of Search .............................. 250/288, 288 A, 250/287, 281, 282, 423 R, 424

[56] References Cited

U.S. PATENT DOCUMENTS 4,458,149 7/1984 Muga .................................... 250/287
5,070,240 12/1991 Lee et al. ............................... 250/287
5,300,785 4/1994 Aitken ................................. 250/423 R
5,464,985 11/1995 Cornish et al. ......................... 250/287

FOREIGN PATENT DOCUMENTS

PCT/US93/03916 4/1993 WIPO .

OTHER PUBLICATIONS

Mamyrin et al., The mass-reflection, a new nonmagnetic time-of-flight mass . . . , Jul. 1973, pp. 45-48.

Oakey et al., An Electrostatic Particle Guide for High Resolution Charged . . . , 1967, pp. 201-228.

Matz et al., Fast, Selective Detection of TCDD Using the Mobile Mass Septectrometer MM 1, 1986, pp. 2031-2034.

*Primary Examiner*—Jack I. Berman
*Assistant Examiner*—Kiet T. Nguyen
*Attorney, Agent, or Firm*—Watson Cole Stevens Davis, P.L.L.C.

[57] ABSTRACT

An ion gun comprises an at least part annular ion source (1,2,3), the source being arranged so that ions are extracted from around the source in a direction perpendicular to the plane of the source. Electrodes (8,9,10) adapted to direct ions towards a location that lies on the central axis perpendicular to the plane of the source. The ion gun can be used alone or in combination with an ion detector (13) to provide a mass spectrometry apparatus.

20 Claims, 15 Drawing Sheets

ION GUN AND MASS SPECTROMETER EMPLOYING THE SAME

BACKGROUND OF THE INVENTION

The present invention relates to ion guns and mass spectrometers. Mass spectrometers offer many benefits for the analysis of unknown gases, either for composition or for trace contaminants, however they have previously been regarded as complex and expensive. The subject of this patent application is a new design ion gun and of mass spectrometer that is relatively simple and compact which should extend the usage of mass spectrometers into new areas.

Mass spectrometers start by vaporising a sample, if not already in the gas phase, and ionising atoms or molecules in the resulting gas to form ions. These atomic or molecular ions are then manipulated by means of electric or magnetic fields, within a vacuum to prevent collisions with ambient gas molecules, in such a way that ions of different masses may be distinguished and their abundance measured. As each element has a different and unique mass the resulting "mass spectrum" may often be relatively easily interpreted in terms of concentrations of different elements. When molecular ions are involved the interpretation may be more complex because a single compound may give rise to several mass peaks due to fragmentation, however there exist databases of mass spectra for most compounds of interest. In particular there is a large body of mass spectral data [(NBS/EPA (USA) MS library (44,000 electron impact mass spectra)] associated with ionisation by means of electron impact.

By comparison with other analytical techniques, for example infra red spectroscopy, mass spectrometry has great advantages because of its applicability to a wide range of compounds together with its high specificity. Unlike most other techniques mass spectrometry allows different isotopes of the same element to be distinguished. It is also particularly well suited to use with a primary separation technique such as gas chromatography, as proposed by G. Matz et al, Chemosphere 15 (1986) p2031.

Mass spectrometers for gas analysis generally consist of a source of ions, a spectrometer where separation according to the mass-to-charge ratio takes place and an ion detector. All mass spectrometers have an evacuated chamber so that the mean free path of the ions of interest is much longer than their intended path within the spectrometer. There are various schemes for separating ions according to their mass-to-charge ratio and because the charge is generally known (e.g. the removal of a single electron) this equates to separation by mass. Most spectrometers effectively act as mass filters, arranging that only ions at, or near to, a certain mass complete the journey from ion source to detector. Examples of this technique are the magnetic or electrostatic sector instruments and Wein filter spectrometers which disperse the ions in space and either have a position sensitive detector or, more usually, a mass selecting aperture or slit. Quadruple spectrometers also work as a narrow bandpass filter, being arranged so that only ions of certain mass to charge ratio have stable trajectories and hence reach the detector. These filter type mass spectrometers can be used to create a mass spectrum by ramping the electric or magnetic fields in such a way that the mass detected is scanned through the range of masses of interest. When a signal from the detector has been collected throughout the range a mass spectrum may be plotted. Clearly when using this method only a small fraction of the ions created in the source actually reach the detector. Other types of mass spectrometer can in principle detect all the ions created in the source. Two examples are the ion trap and the time-of-flight mass spectrometer.

A number of factors affect the suitability of a particular spectrometer for a particular application: the constraints that it places on the source, such as range of ion energies accepted and the permissible physical source size; the ability to resolve small differences in mass; the transmission efficiency from source to detector; the range of masses covered and the complexity, and hence cost, of construction. Where a relatively small and inexpensive mass spectrometer has been required for gas analysis, by far the most common choice has been the quadruple mass spectrometer (see P. H. Dawson and N. R. Whetton, Advances in Electronics and Electron Physics, Chap III p60). Whilst it is possible to make these small and no magnetic fields or fine apertures are required, the quadruple does suffer a number of disadvantages: radio frequency power supplies are required, the mass range is usually rather limited, the mass resolving power is relatively low, the energy acceptance is only a few tens of volts, the source size must be fairly small compared with the spectrometer size, the transmission at any given mass is low, and it needs to be scanned to produce a spectrum. For these reasons other arrangements are increasingly being considered, in particular time-of-flight spectrometers.

In a time-of-flight mass spectrometer, as the name implies, the mass of an ion is deduced from the time taken for it to make the journey from source to detector. The transmission is usually not mass dependent over the range of interest and there is therefore no need for scanning. In addition the transmission efficiency may be quite high over a large range of source energy, for a physically large source and with good mass resolving power. The source needs to be pulsed in order to give a well defined start point for the ions, however apart from this, the remaining voltages may be static and hence require minimal power consumption. The arrangement of electrodes required is relatively simple and no magnetic fields are required, thus avoiding all the problems of weight, memory effect and non-linearity associated with magnetic materials. In principle the mass range is limited only by the length of time that the experiment is allowed to proceed after each pulse from the source. A recent readable review of time of flight technology is given by Cotter in Analytical Chemisty, 64 (1992) p1027.

Although time-of-flight spectrometers have been available commercially for some time, the MA-1 from the Scientific Instruments and Vacuum Division, The Bendix Corp. USA, for example, they are not widely used outside the analytical laboratory. This is because until relatively recently the electronics required for the timing measurement has been expensive and inconvenient to use. However the desire for very fast digital communications has now pushed electronics technology to the speeds required for this application.

When designing an electron impact ionisation source, the aims are: to have a high ionisation efficiency of the gas that is allowed in, to have efficient pumping of the source to remove any remaining neutral gas and to be matched to the spectrometer so that the ions produced are detected whilst maintaining the desired mass resolution. If the source is to be used for residual gas analysis then the source volume should be reasonably large so that a good number of gas atoms are available to be ionised. In practice these various requirements conflict. In particular it is difficult to have a large enough source volume to include many neutral species whilst at the same time getting: (a) an electron source close enough to give good ionisation, (b) ion extraction optics that are close enough to extract a beam of ions with dimensions that allow efficient transmission through the spectrometer at good mass resolution, which implies an ion beam narrow in at least one dimension and possibly two, unless the detector is to be rather large (c) a gas inlet, if there is one, close to the source region so that most of the neutral gas atoms/molecules emerging from the inlet pass through the ionisation region, and (d) the pumping used to remove excess gas close to the source region, preferably opposite the gas inlet, so that the gas that does not get ionised is pumped away immediately rather than finding its way into the rest of the spectrometer.

SUMMARY OF THE INVENTION

The invention is aimed at overcoming these conflicting requirements.

According to the present invention there is provided an ion gun comprising:

an at least part annular ion source, the source arranged such that, in use, ions are extracted from around the source in a direction perpendicular to the plane of the source; and directing means adapted to direct ions towards a location that lies on the central axis of the source in use.

The invention provides a particular arrangement of ionisation source that can be used in combination with an ion detector to provide a time of flight mass spectrometer involving a novel geometry, with the possibilities of high duty cycle, carrier gas rejection, some energy selection, and with a compact and effective correction of flight time for different starting positions within the source.

Apart from the desire to have high sensitivity, there is another very important potential advantage to a gas analyser that makes very efficient use of the gas that is leaked into it. Mass spectrometers have to be pumped down to a good vacuum and the pumps are relatively expensive, power hungry and heavy. Thus, minimising the flow of gas required for analysis can greatly decrease the cost of an instrument and eases the problems associated with an attempt to make it portable.

In a time of flight mass spectrometer the ion source must be pulsed in some way, as there needs to be a reference, or start time, in order to deduce a flight time from the detected ion arrival time. Another important aspect of the source therefore, is any uncertainty that it introduces into the measured flight time. For gas sources the ion extraction voltage is usually pulsed at the start of each cycle of the spectrometer (see W. C. Wiley and I. H. Maclaren Rev. Sci Instrum. 26 (1955) p1150). Ions that start spaced at different points along the direction of subsequent flight will tend to have different flight times by virtue of their starting positions rather than by virtue of their mass, hence blurring the resulting mass spectrum. Although this effect can to some extent be compensated for (see space/energy focusing below) an ion source intended for a time of flight spectrometer should be kept relatively small in the dimension along the flight line with minimal initial velocity spread in that direction. For this reason the gas inlet is often mounted so that the initial neutral velocities are perpendicular to the ion flight path (see T. Bergmann et al Rev. Sci Instrum. 60 (1989) p792).

Other less important considerations also apply. It is convenient for the source and analyser to posses cylindrical symmetry, as manufacture and design analysis is easier. Also for many applications the analyser should be compact. This requirement, together with a need for time focusing, discussed below, often leads to the use of an electrostatic reflector in the spectrometer. As this places the ion source and the detector at the same end of the analyser, provision has to be made to avoid a conflict.

According to a further aspect of the invention, there is provided a time of flight mass spectrometer design comprising a source region where there is an electrostatic extraction field that accelerates ions into an accelerating region;

a further electrostatic field larger than the first;

at least one field free flight region;

an electrostatic reflector; and, a detector, the regions of flight path being capable of adjustment in terms of length or field strength in such a way that the total flight times of ions from different initial start positions on a line parallel to the extraction field are independent of the position of the starting point to the second order.

Thus, if the deviation in the total flight time of an ion starting at x, where x is the initial start position on a line parallel to the extraction field, from the total flight time of an ion starting at x equal to zero, were to be expressed as a power series expansion in x, the coefficients of the x term and the $x^2$ term would both be zero.

BRIEF DESCRIPTION OF THE DRAWINGS

Various examples of typical electron impact sources already known and in accordance with the invention will now be discussed, with reference to the accompanying drawings, in which:

FIG. 4 shows an annular ion source employed in the ion gun of the present invention;

FIG. 4A–4C shows a simple spectrometer employing the ion gun of the present invention;

DESCRIPTION OF THE INVENTION

Figure 1:
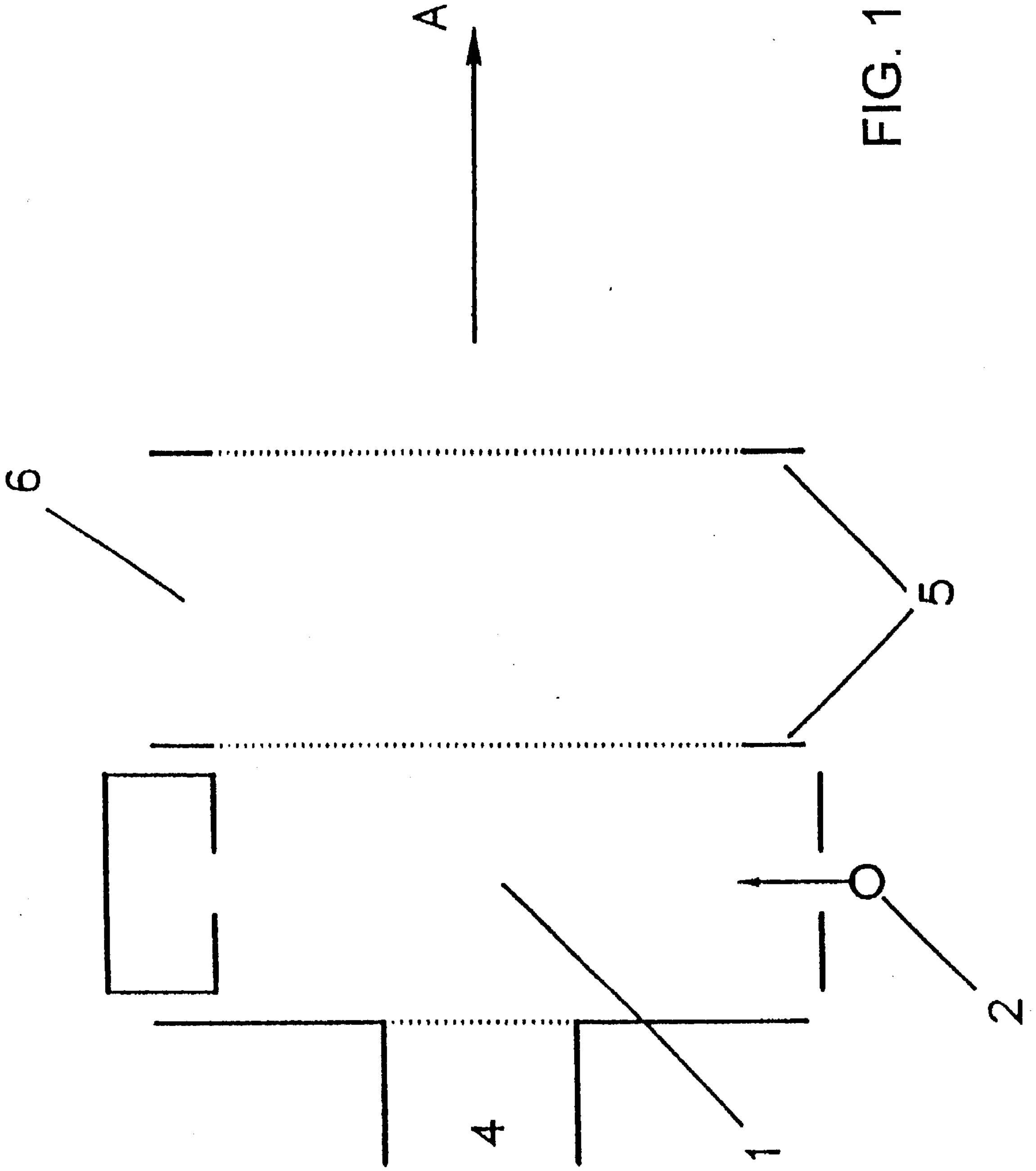
FIG. 1 is a schematic diagram of a prior art spectrometer ion source.

FIG. 1 shows the electron impact ion source used by Wiley and Maclaren. Ions for analysis are extracted from the centre of the ionisation region 1, which is some distance from the filament 2 that supplies electrons. The gas source 4 is parallel to the ion flight line A, which tends to limit the resolution and encourages gas to enter the spectrometer (not shown). Grids 5 define an acceleration region 6. The ionisation region volume is limited to the extracted beam diameter in two directions, which in turn is limited by the size of the detector available at the far end of the spectrometer, where the ion beam is of similar size to that emerging from the source. The source thickness in the third direction, along the flight line A, needs to be kept small to achieve reasonable mass resolution in the spectrometer, as previously discussed.

Figure 2:
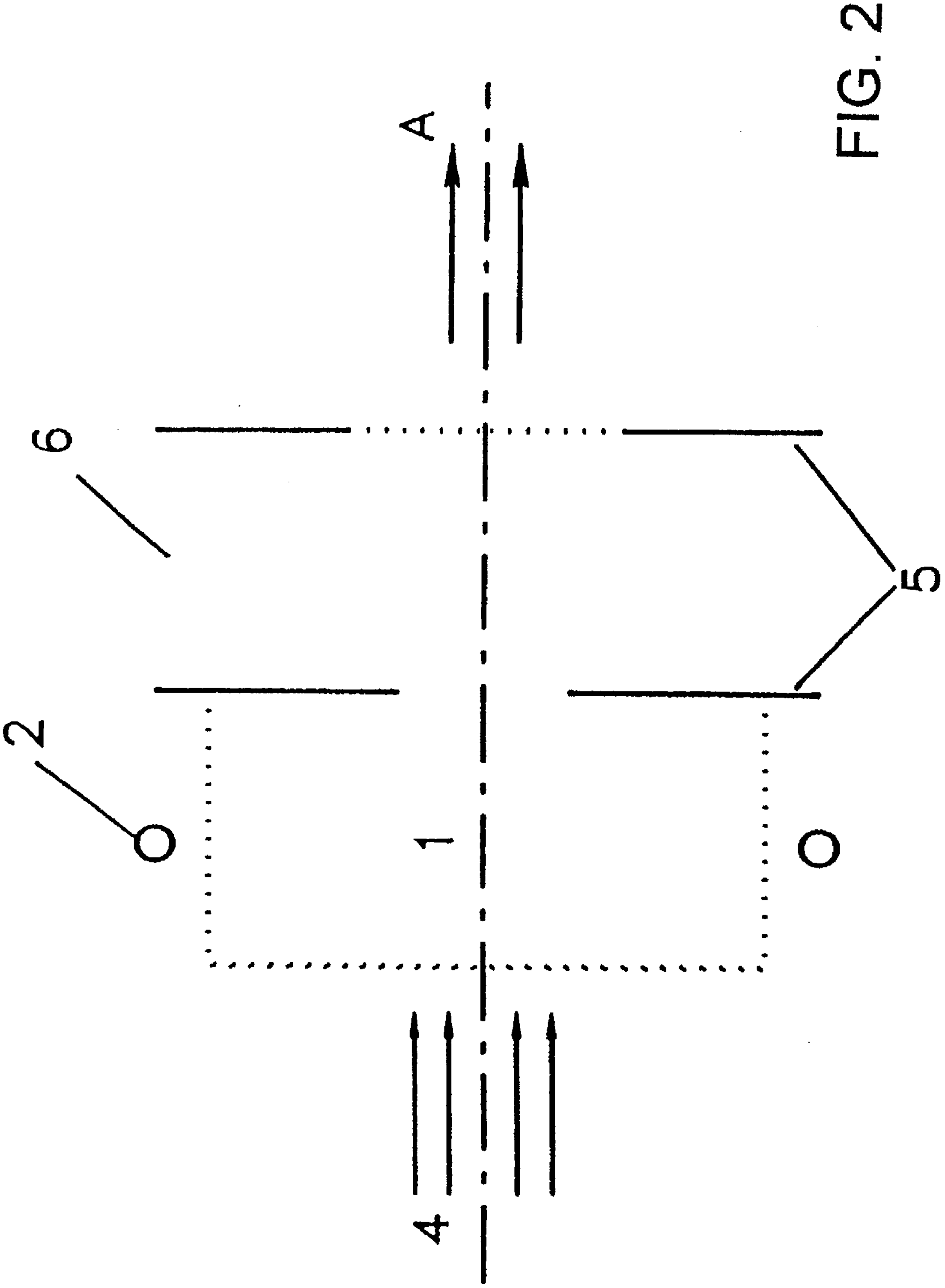
FIG. 2 is a schematic diagram of a prior art electron impact ion source.

FIG. 2 shows an electron impact source with a larger ionisation region volume. Here the electron emitting filament 2 is a ring around the ionisation region 1. However the ionisation region is still limited by the detector size available to receive the ion beam. Even if a large (and therefore more expensive) detector is available, the larger the ionisation region the further the electron emitting filament 2 is from the centre of the ionisation region and hence the weaker the electron density there. This ion source does however have the advantage of cylindrical symmetry.

A similar source geometry is used by Della-Negra (Anal. Chem. 57 (1985) p.2035) who also achieves cylindrically symmetry in the overall analyser by directing the ion beam from the source, through a hole in the detector, thence to an electrostatic reflector which spreads and returns the ionbeam to the detector. Although this is a compact and symmetrical design, it suffers the problems of limited ionisation region size; ion detectors which include a hole are generally more expensive and there is likely to be undesirable time dispersion associated with the deliberate introduction of divergence in the beam so that it falls on the detector rather than returning to the source.

One advantage that time of flight spectrometers, in particular, posses is that they may have a fairly open geometry. This means that the ion beam may potentially quite large in at least one dimension providing the detector is large enough to intercept the beam at the exit of the spectrometer. An ideal situation would be one where the exit beam is small, but the possibility for a large beam emerging from the source can be used to increase the ionisation region volume for greater sensitivity. The invention disclosed here has just these properties plus others besides.

Figure 3:
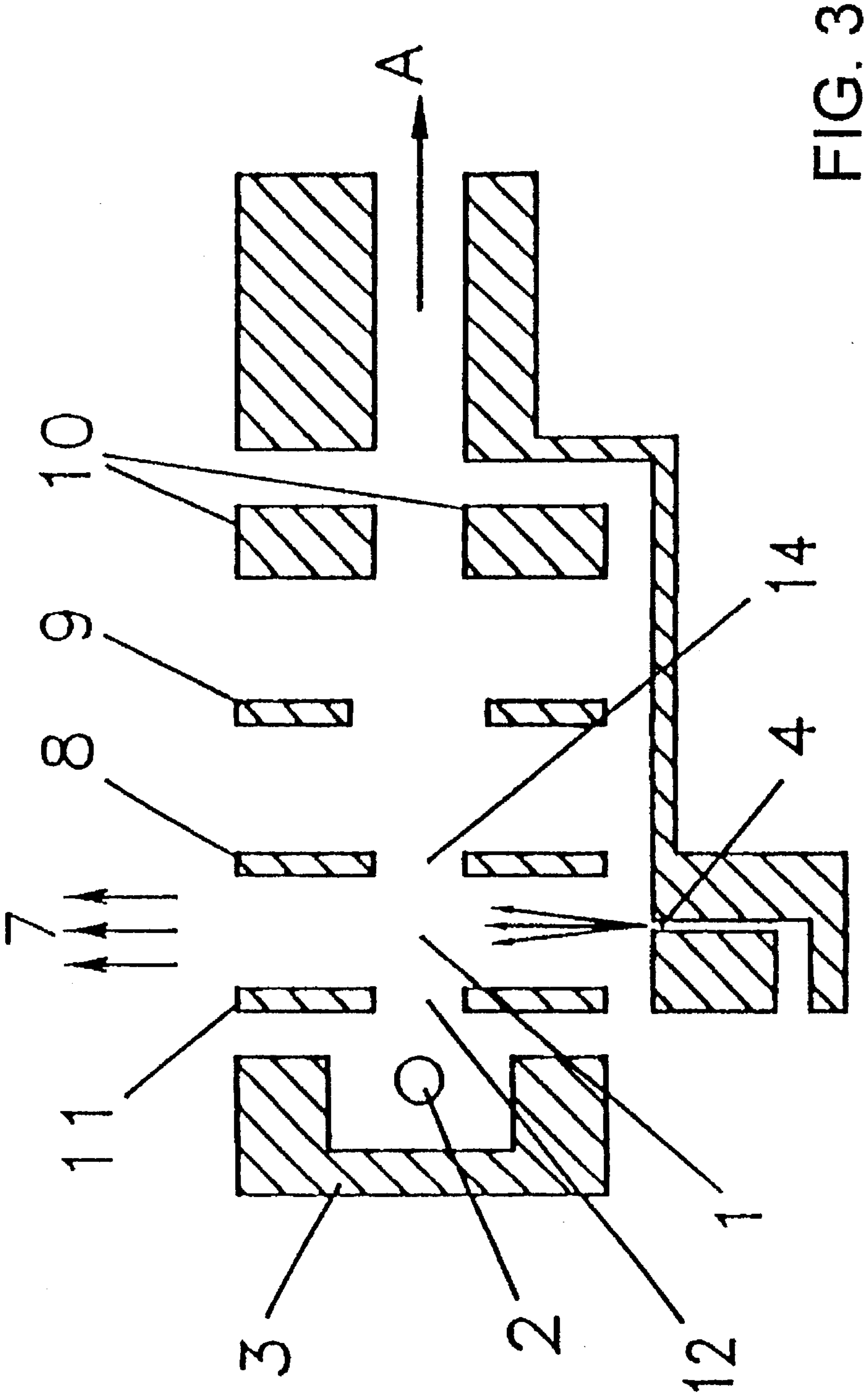
FIG. 3 is a schematic diagram of a second prior art electron impact ion source.

FIG. 3 shows an electron impact ion source with a gas inlet 4, pumping 7, and ion extraction optics 8,9,10 clustered closely around the ionisation region 1. Such a source would be operated in a time-of-flight spectrometer or pulsed gun by applying the following cycle of events repetitively.

In the first phase the ionisation region is largely field free with the source backplate 11 and ion extractor 8 held at the same voltage. During this phase, voltages on the filament 2 and electron repeller 3 accelerate electrons emitted from the hot filament 2 through the aperture 12 in the source backplate 11 and into the ionisation region 1, where they collide with neutral species to form ions.

In the second, much shorter phase, the voltage on either the source backplate 11 or the ion extractor 8 is suddenly changed so as to produce an electric field that accelerates ions from the ionisation region 1 through the aperture 14 in the ion extractor 8 towards the spectrometer. Having passed through the aperture 14 the ions may be further accelerated and focused or deflected by the steering/focusing electrodes 9,10.

The dimensions of the source are severely constrained in dimensions of the plane of the paper, however there is no reason in principle why the source should not be extended some distance in the direction perpendicular to the plane of the diagram. Such a line source could have a relatively large ionisation volume whilst keeping critical dimensions small as discussed above. A long straight line source would however require either a long detector, which would be expensive, or some ion optics to reduce the long dimension in the spectrometer whilst maintaining the mass resolution. This would in practice be very difficult, as ions from the ends of the source would travel on a very different path from those starting from the centre.

Figure 4B:
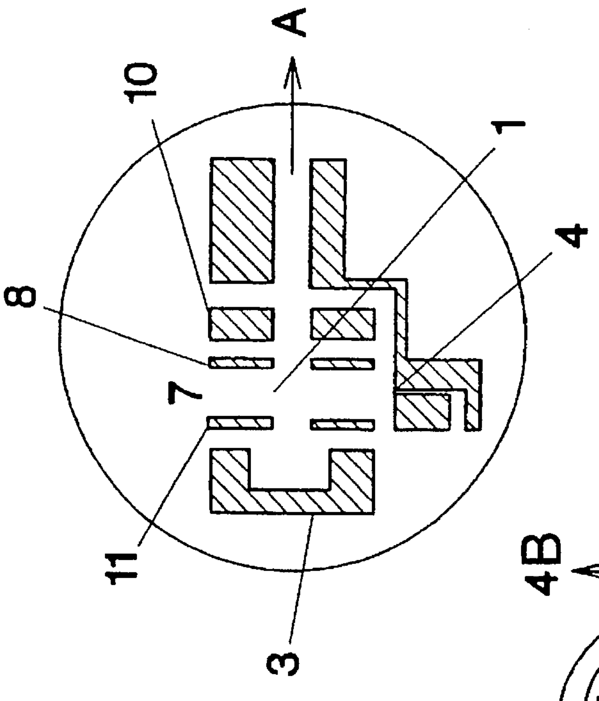
Figure 4A:
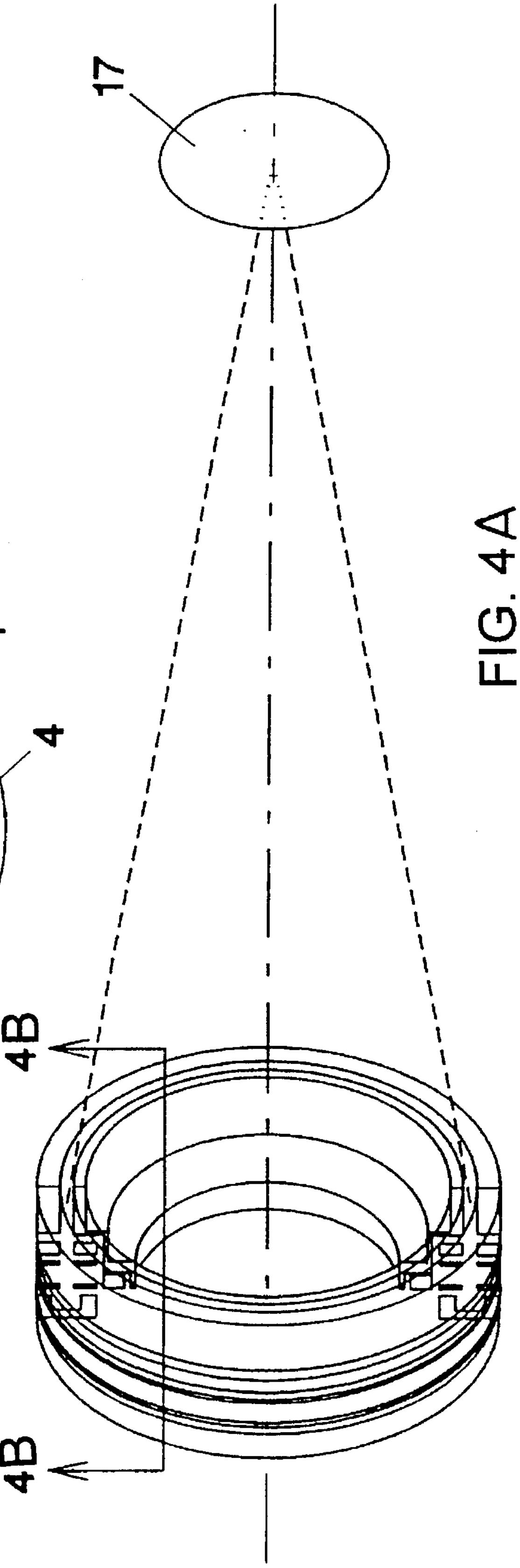
FIG. 4A is an enlarged cross-section taken along line 4A—4A of FIG. 4.
Figure 4D:
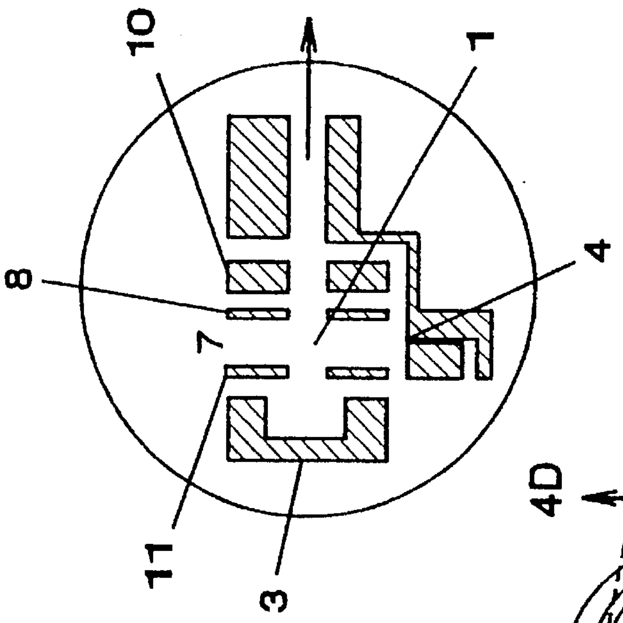
FIG. 4D is an enlarged section taken along line 4D—4D of FIG. 4C.
Figure 4C:
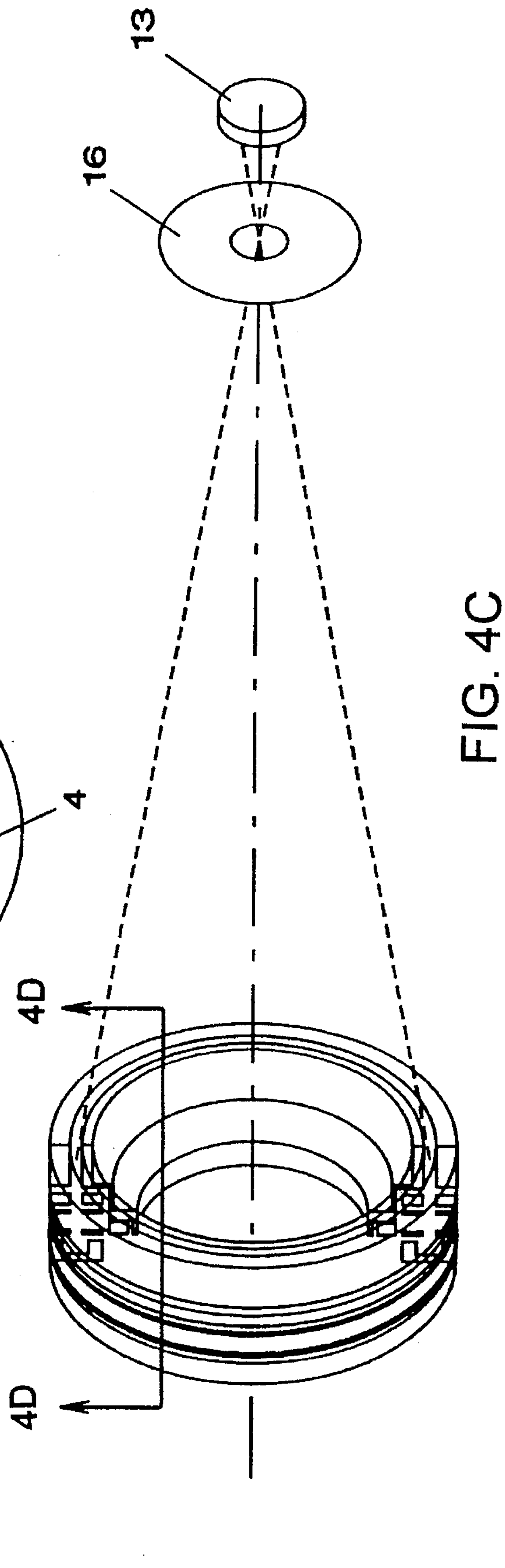

The solution, as proposed by this invention, is to have a long source that is bent into a circle, an annular ion source, where the emerging ion beam starts perpendicular to the plane of the annulus, but is then deflected by a small angle in towards the central axis perpendicular to the annulus. FIGS. 4A–4B show how a simple ion gun might be constructed along these lines. It can be seen that the source cross section is similar to that of FIG. 3, rotated about the axis of symmetry of the gun. Components that correspond to those in FIG. 3 are identically numbered. In this example the ion trajectories lie close to the surface of a cone and the rotational symmetry means that ions from all parts of the source experience a similar flight path to the target 17. In principle this type of source could be used with any spectrometer that could be constructed in a form with rotational symmetry about the axis of the source annulus, FIGS. 4C–4D show a time-of-flight spectrometer employing this source where a control aperture 16 and ion detector 13 have been added. In other spectrometers it might be advantageous to have an extended portion of the flight paths lying on a cylindrical surface, or cones of different angles. The common part of the design would be a source comprising a circular annulus, together with flight paths that lie within a thin shell rotationally symmetric about the central perpendicular axis of the source annulus.

A particular advantage of the above arrangements is that the gas source 4 may be brought very close to the ionisation region 1 and pumping 7. The gas pressure in the annular entry is arranged to be very low, by means of an external pressure reducing stage, so that conditions of molecular flow apply. Under these circumstances the neutral gas molecules emerge into the source with velocities that range over a relatively narrow range of angle (in the plane of the diagram). This has two advantages; firstly the neutral velocity component along the subsequent ion flight line A is low, making good mass resolution easier to achieve. Second, nearly all the neutrals that are not ionised and extracted proceed directly across the source into the pumping aperture 7 without ever entering the spectrometer. Providing the pumping is sufficiently efficient that only a low proportion of neutrals reemerge, a substantial effective pressure (or neutral particle number density) differential is established between the source region and the rest of the spectrometer, without the need for a particularly small ion exit aperture.

Figure 5:
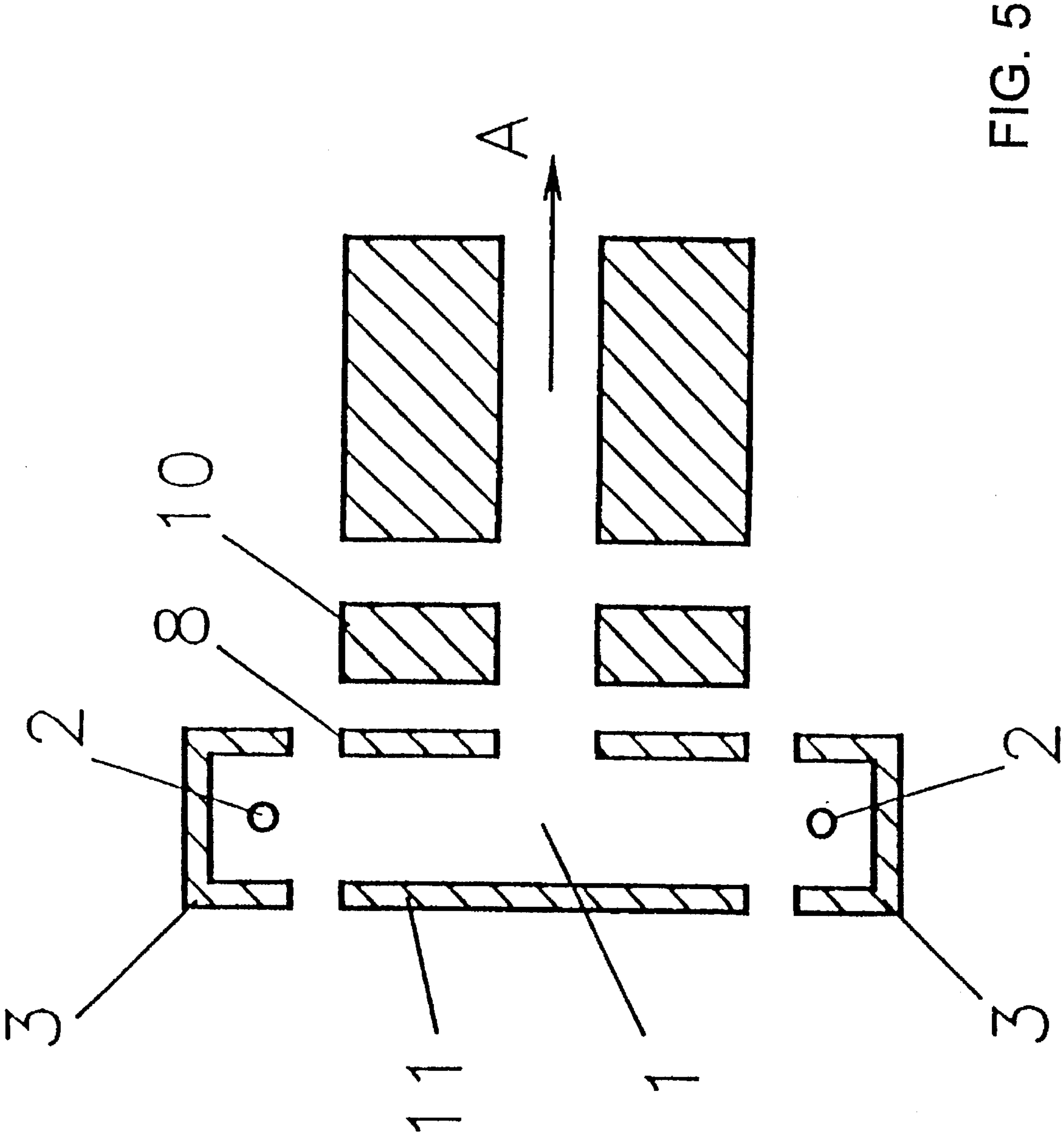
FIG. 5 is a diagram showing an ion source employing two filaments that may be employed in the present invention.

It can readily be appreciated that the source cross section of FIG. 3 is not the only geometry that might be usefully extended into an annulus. For example, FIG. 5 shows a source cross section with two electron emitting filaments 2 that might be used for residual gas analysis in vacuum chambers. Again the advantage of the annular arrangement is that certain items, in this case the filaments 2, may be brought very close to the ionisation region i whilst at the same time having a long source for greater ionisation region volume and having an ion beam that converges to a small diameter at some later point in the spectrometer. Many other variations are possible and will be apparent to the skilled man.

Figure 6:
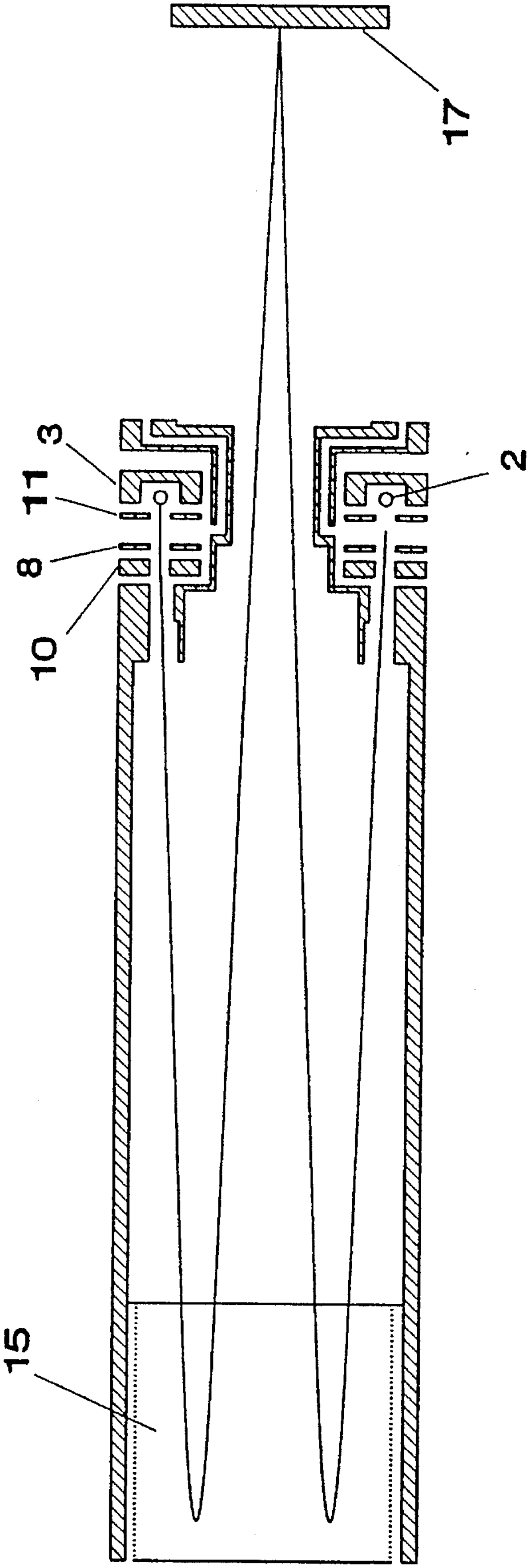
FIG. 6 is a diagram showing a further example of the ion gun of the present invention.
Figure 6A:
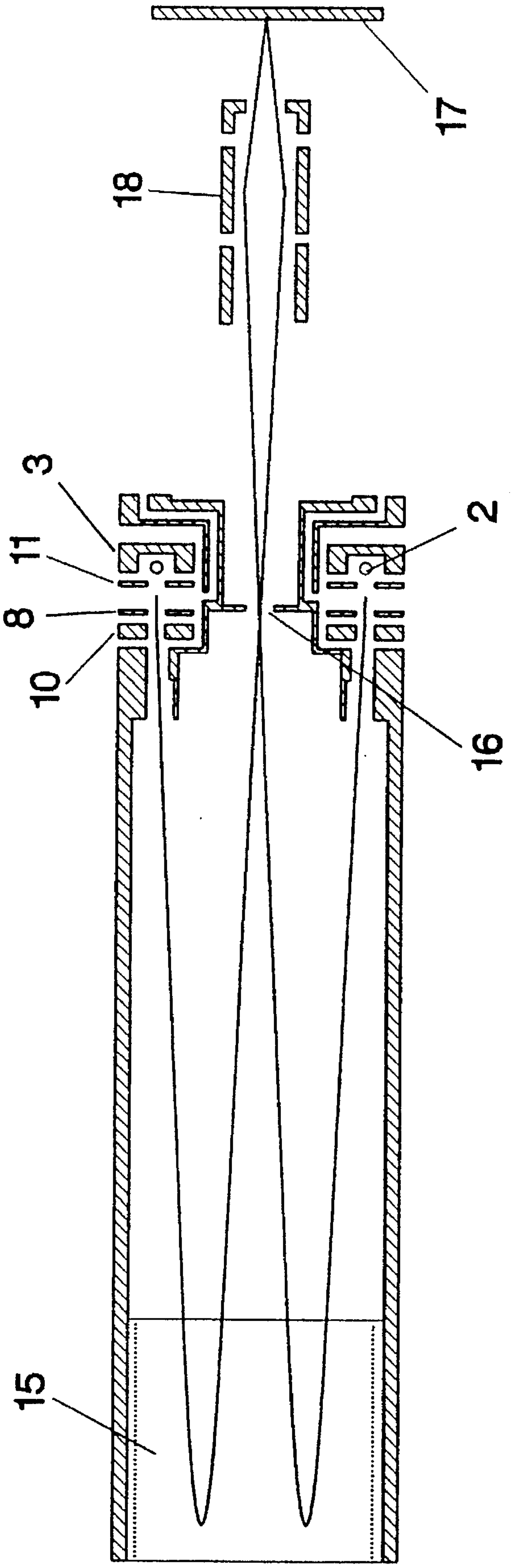
FIG. 6A is a diagram showing the example of FIG. 6 employing an electrostatic lens.
Figure 6B:
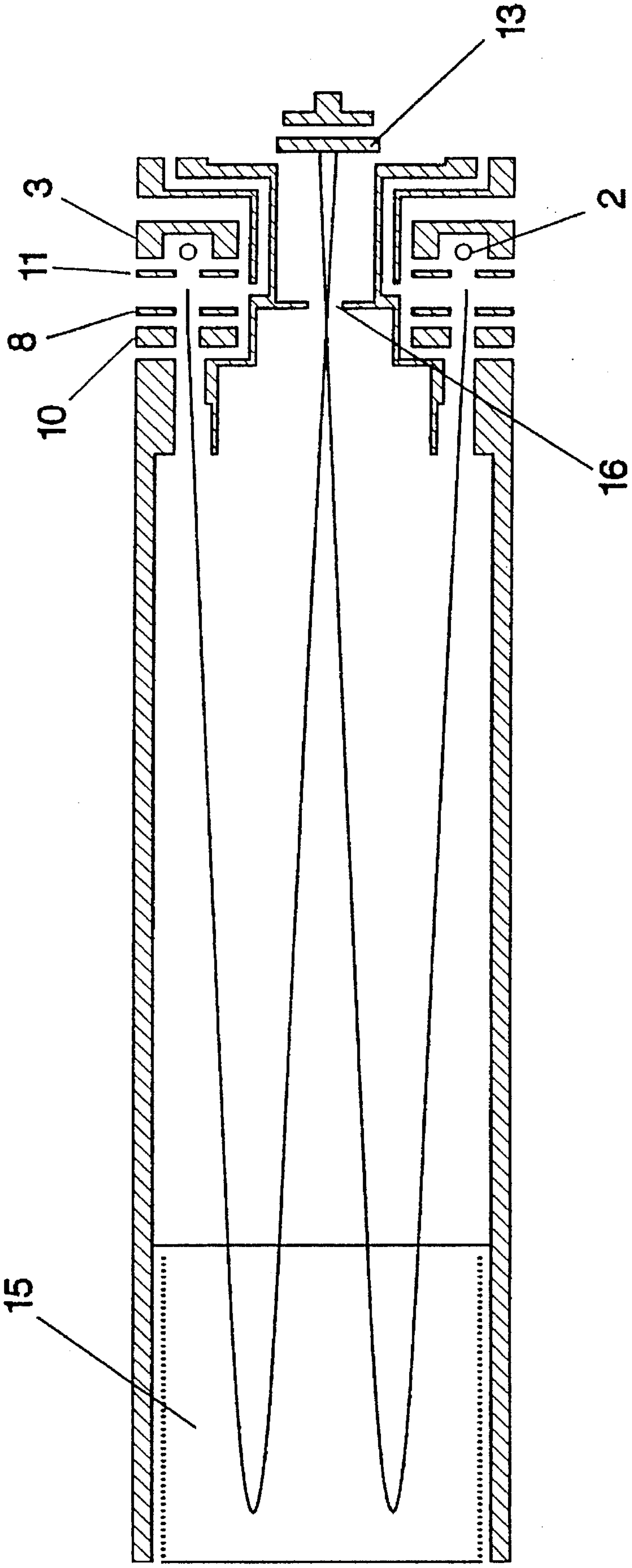
FIG. 6B is a diagram showing a time-of-flight spectrometer employing the ion gun of the present invention.
Figure 6C:
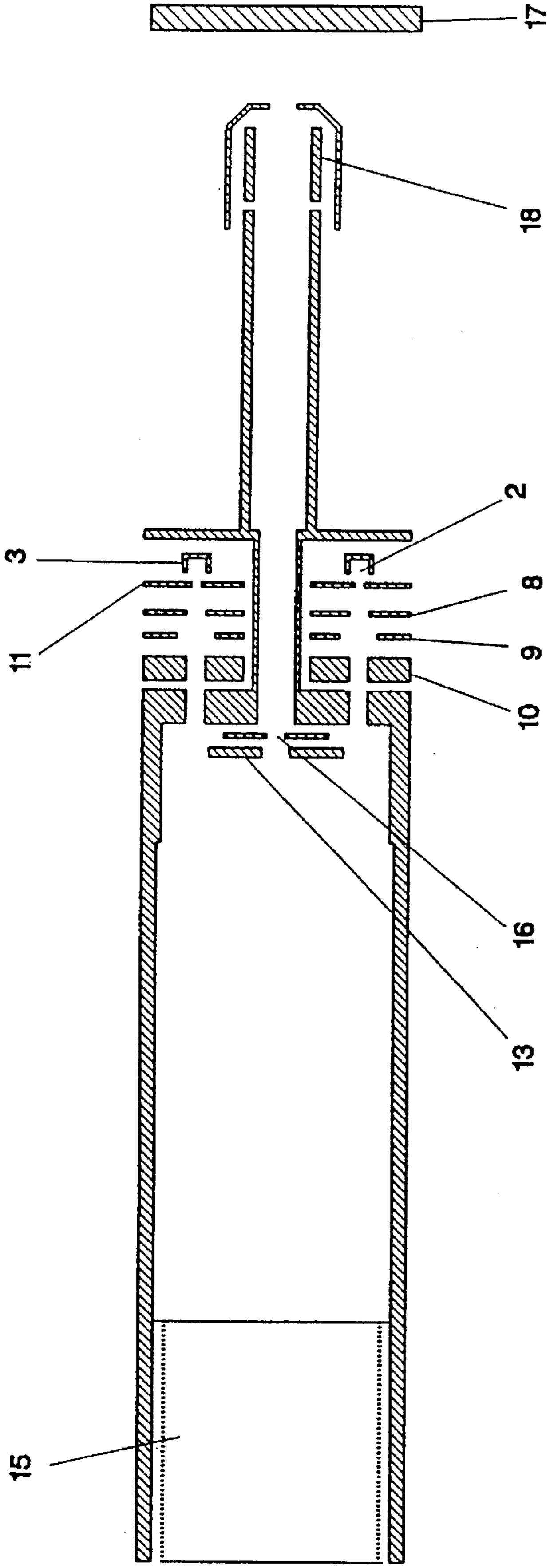
FIG. 6C is a diagram showing the present invention employed in a dual purpose role as a primary ion gun and time-of-flight spectrometer employed in secondary ion mass spectrometry.

FIGS. 6 to 6C are schematic cross sectional views of other implementations of the annular source ion gun. In this case an electrostatic reflector (known as a reflectron) 15 is used to direct ions back toward the source, making the analyser employing the invention more compact and at the same time allowing time focusing to be achieved (see below).

FIG. 6 shows the annular source ion gun of the present invention employed to bombard a sample 17 with ions of known mass. FIG. 6A shows a similar arrangement but with an electrostatic lens 18 employed to focus ions on to the sample 17.

FIG. 6B shows a mass spectrometer employing the present invention, in which a reflector 15 directs ions of unknown mass towards an ion detector 13. The device of FIG. 6C is similar to that of FIG. 6A, except that a detector 13 has been added for analysis of ions sputtered from the sample 17 that are collected by lens 18, directed into the device and reflected back towards the detector 13 by the reflector 15. The device thus acts as both a pulsed source of primary ions and a time-of-flight mass analyzer for secondary ion mass spectrometry.

Figure 7:
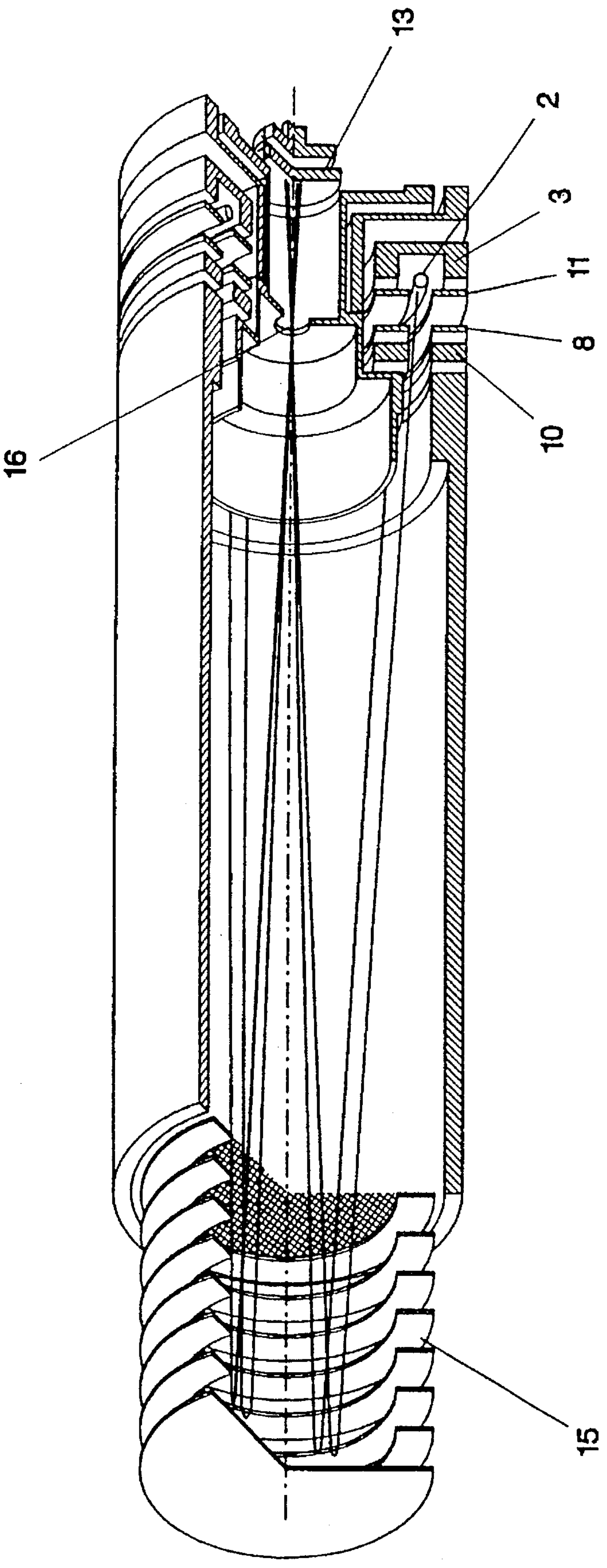
FIG. 7 is an alternative view of the device of FIG. 6B.

It can be seen that an annular source provides a simple solution for the problem, mentioned earlier, created by having both source and target 17 or detector 13 at the same end of the spectrometer. The ions returning from the reflector 15 pass through the centre of the source annulus and then on to the detector 13, which may be mounted near the outside of the analyser, where the geometrical constraints are fewer and where access is easy. FIG. 7 is an alternative view of the arrangement of FIG. 6B drawn to give a clearer view of the shape in three dimensions. A portion of the analyser has been cut away in this view so that the trajectories can be seen inside.

In some circumstances the full volume of the annular source might not be required. In these circumstances a design could be used where a multiple of smaller sources are arranged around the annulus. Such an arrangement might have advantages for reliability as if one source failed a simple switch could be made to a spare. Alternatively multiple sources of gas from different sources could be analysed together with very little risk of cross contamination.

One potential drawback of time of conventional flight mass spectrometers is that the source, because it has to be pulsed, tends to have a low duty cycle. This is only a problem where the material to be analysed can only be supplied in a continuous stream, in which case part of the stream may be missed leading to a lower sensitivity for the analyser. If the ions created in the source can be persuaded to stay there until the next ion extracting pulse, that starts each cycle of the spectrometer, then they will be detected. Taking the example of an electron impact gas analyser, the gas stream will have a velocity of the order of 300 m/s, so assuming the source region is relatively field free during the electron impact phase of the cycle (as opposed to the brief ion extraction phase) and assuming that the repetition rate is 100 kHz, ions created just after an ion extraction pulse will move 10 μs ×300 m/s=3 mm before the next ion extraction pulse. Providing the ion extraction optics has been constructed so that ions are efficiently extracted from a region at least 3 mm thick in the gas flow direction there is the possibility that all the sample stream will be used.

The above example assumes a practical, but rather high, repetition rate and the implied source dimension is still quite large. Longer cycle times, to examine high masses or to make use of a longer flight tube, would benefit from some form of deliberate ion storage mechanism, as opposed to leaving the source region field free. In some cases this may be achieved simply by the existence of a weak electrostatic field associated with the space charge of the electron beam, particularly if the source geometry is optimised with this in mind. This is made easier by the annular geometry. An alternative method would be to apply a radio frequency voltage to the four rings 9,10 immediately surrounding the source region to create an RF quadruple that is bent into a circle. This method could potentially confine ions with somewhat greater initial energies. The RF field would be chosen to allow stable trajectories for all masses of interest which would then drift relatively slowly around the ring source. The RF field would be switched off during the ion extraction phase.

A third method of ion storage would be to mount a thin conducting wire in the centre of the source region, extending around the source annulus. A voltage is applied to the wire so as to attract ions towards it, thus tending to keep ions within the source region. This use of a "guide wire" is already known (see Oakley and R. D. Macfarlane, Nuclear Instrum. and Methods 49 (1967) p220).

A fourth method of ion storage would be to arrange a weak electrostatic field using either a cylindrical or toroidal electrodes around the ionisation region.

Figure 8:
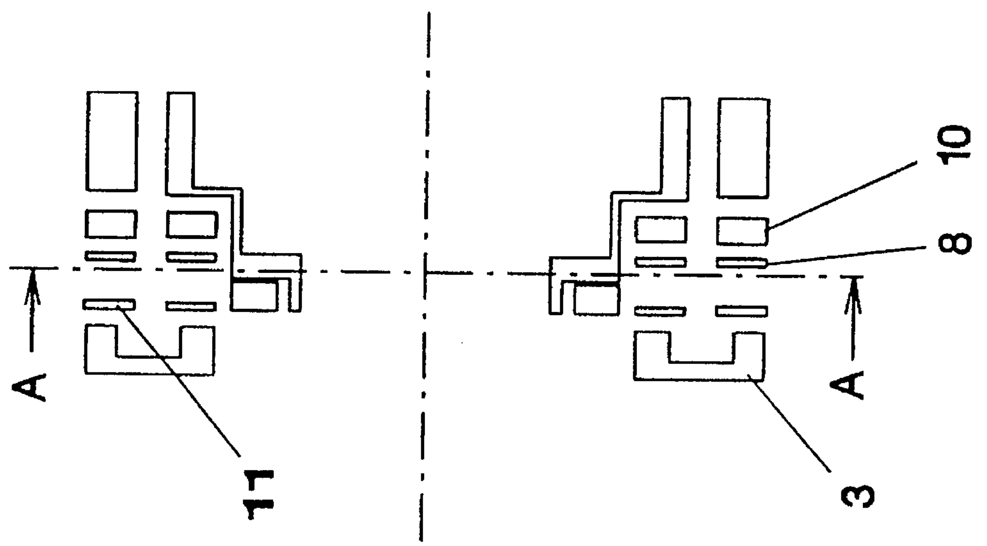
FIG. 8 is a diagram showing a side section through the ion gun of the present invention.
Figure 8A:
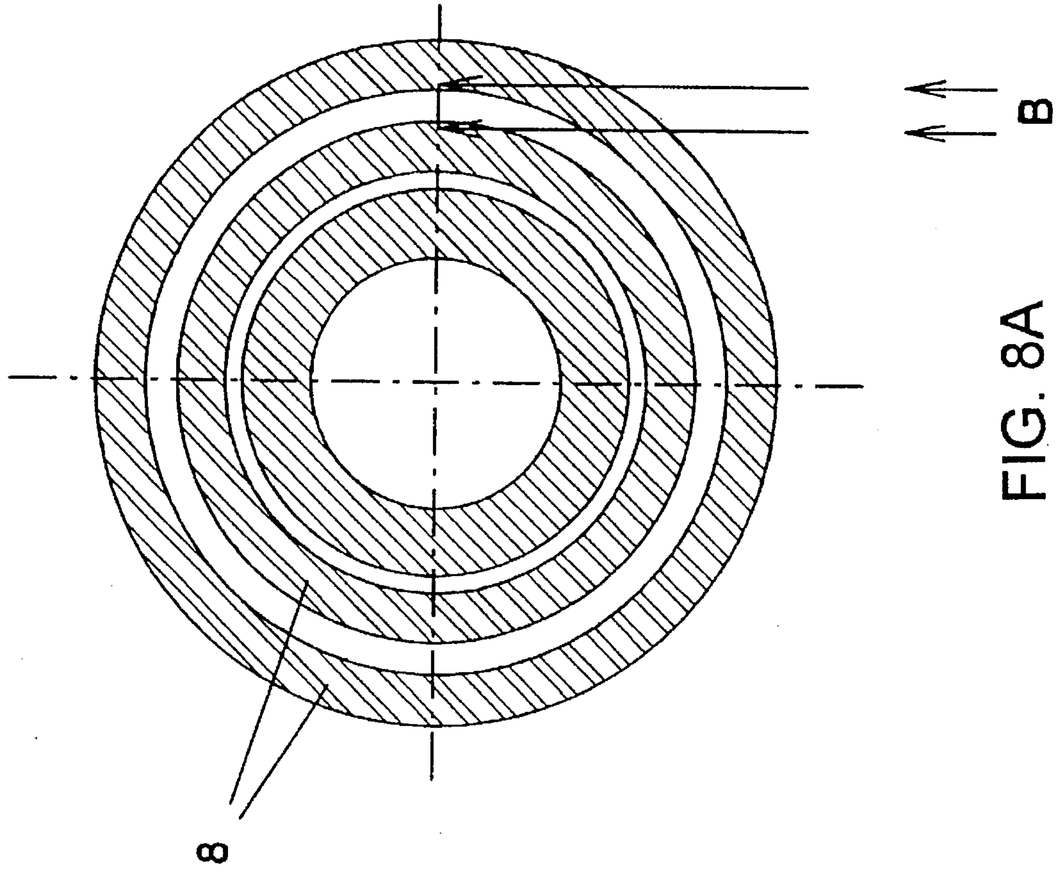
FIG. 8A is a cross-section taken along line 8A—8A of FIG. 8.

To improve the ion storage properties it may be advantageous to inject the ions or neutrals into the ring tangentially in the direction B, see FIGS. 8–8A. The initial particle velocity is then initially along the long dimension of the source and the ion trapping mechanism now has to merely impose a relatively gentle curve on the initial velocity to potentially store the ion indefinitely. This would be of particular use for interfacing the spectrometer to a continuous source of relatively energetic ions (relative to thermal energies that is) for example an inductively coupled plasma source.

Referring back to FIGS. 4C–4D and 7 and noting the presence of the circular aperture 16, a particular advantage of the annular source is that the ion trajectories from the extended source can be brought to a focus. An aperture at this point then allows mass or energy selection. Ions from the source will only pass through the aperture if the correct voltages have been applied to the steering/focusing ring electrodes 9,10 (shown in FIG. 3) and the ions fall within a certain energy range and starting position. By controlling this range an aperture allows the mass resolution of the spectrometer to be increased at some expense in sensitivity. Because the sensitivity of this geometry is already very high it is likely that such a tradeoff will be beneficial.

In the case of a time of flight mass spectrometer, if the voltage at the ring deflection electrodes 10 is pulsed away from the correct voltage briefly then some mass discrimination may be introduced. For this effect to occur the ions must have already spread out in space by the time they reach the deflectors so that a brief pulse on the deflection electrodes affects only a limited range of masses. This may require a second set of deflection rings to be mounted further down the spectrometer, away from the source where the spatial spread of ions with varying masses is somewhat greater. An example where the rejection of a particular mass would be beneficial would be an application where the sample components of interest are contained in an abundant carrier gas. In this case rejection of the carrier gas signal would prolong the life of the detector and prevent the data system spending time processing data of no interest. A second example would be rejection of heavy ions, above the mass range of interest, which might otherwise be detected after the start of the next spectrometer cycle and therefore be interpreted incorrectly by the data system as light ions.

Figure 9A:
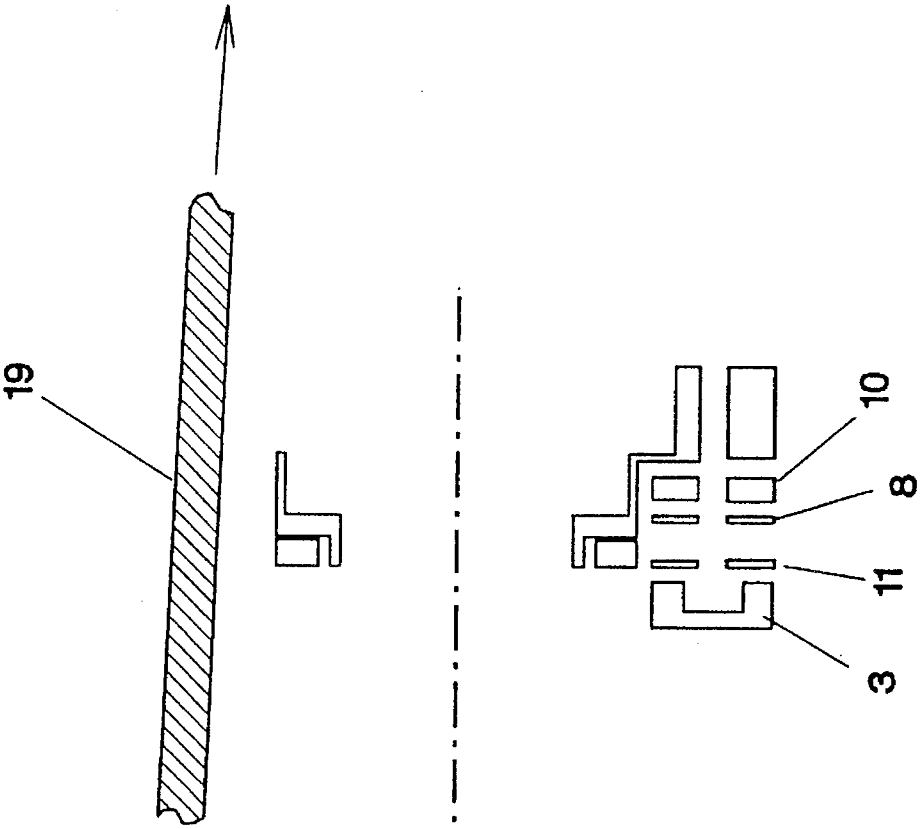
FIG. 9A is a section taken along line 9A—9A of FIG. 9.
Figure 9:
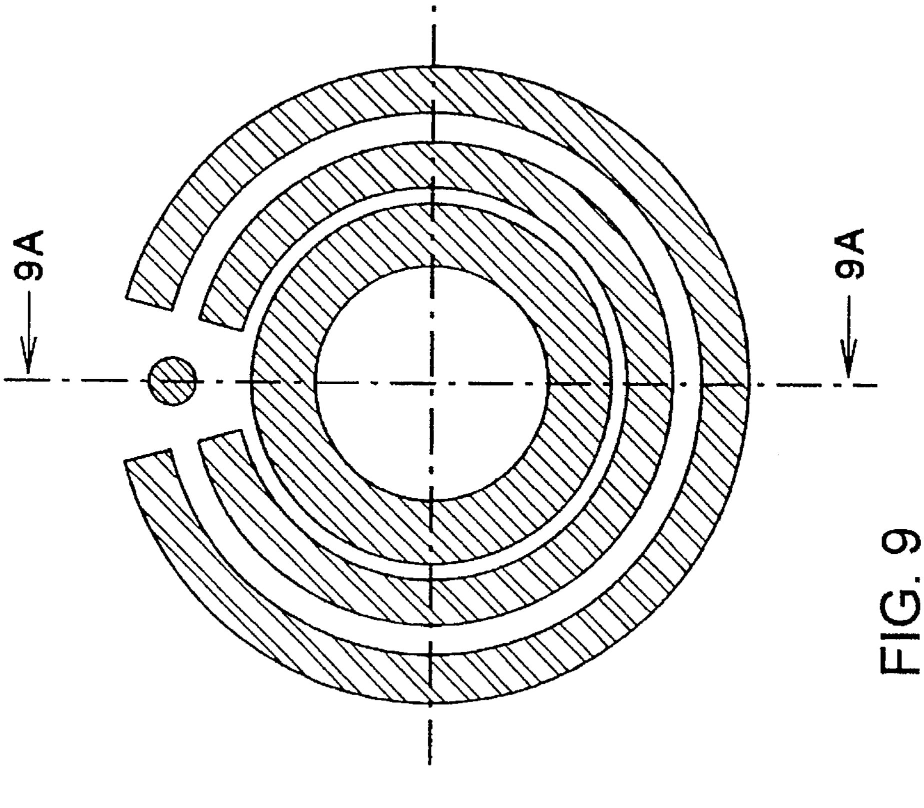
FIG. 9 is a diagram showing an example of an ion gun employing a combination geometry for time-of-flight mass spectrometry of both residual gas and a secondary source of ions.

In certain applications it may be advantageous to have a single spectrometer analyse more than one source of material, for example ions sputtered from a solid surface (SIMS) and residual gas in a vacuum system. In this case it might be better to construct the electron impact source along part of the annulus only, leaving a gap for introduction of an ion beam collected via conventional extraction optics. FIGS. 9–9A depict an example of such a combination geometry for SIMS and residual gas analysis. The SIMS ions would be pulsed by pulsing a primary ion gun (not shown) and the SIMS extraction optics 18 used to form a narrow beam 19 to be injected directly into the spectrometer. The use of a reflecting geometry, as shown elsewhere, would allow the spectrometer to be re-tuned for operation of either source, manipulating the reflectron voltage for optimum mass resolution in each case.

In a time of flight mass spectrometer the mass of a detected ion is deduced from its time of arrival at the detector with respect to some reference time. For accurate measurement of mass it is therefore undesirable for the arrival time to depend on anything other than mass, for example starting position within the source or energy within the spectrometer. A particular potential problem with the source depicted in FIG. 3 is that ions of the same mass, at different positions within the source when the ion extracting field is turned on, will acquire different energies and hence have different velocities on emerging from the source. They will therefore tend to have different flight times and not arrive at the detector together.

Figure 10:
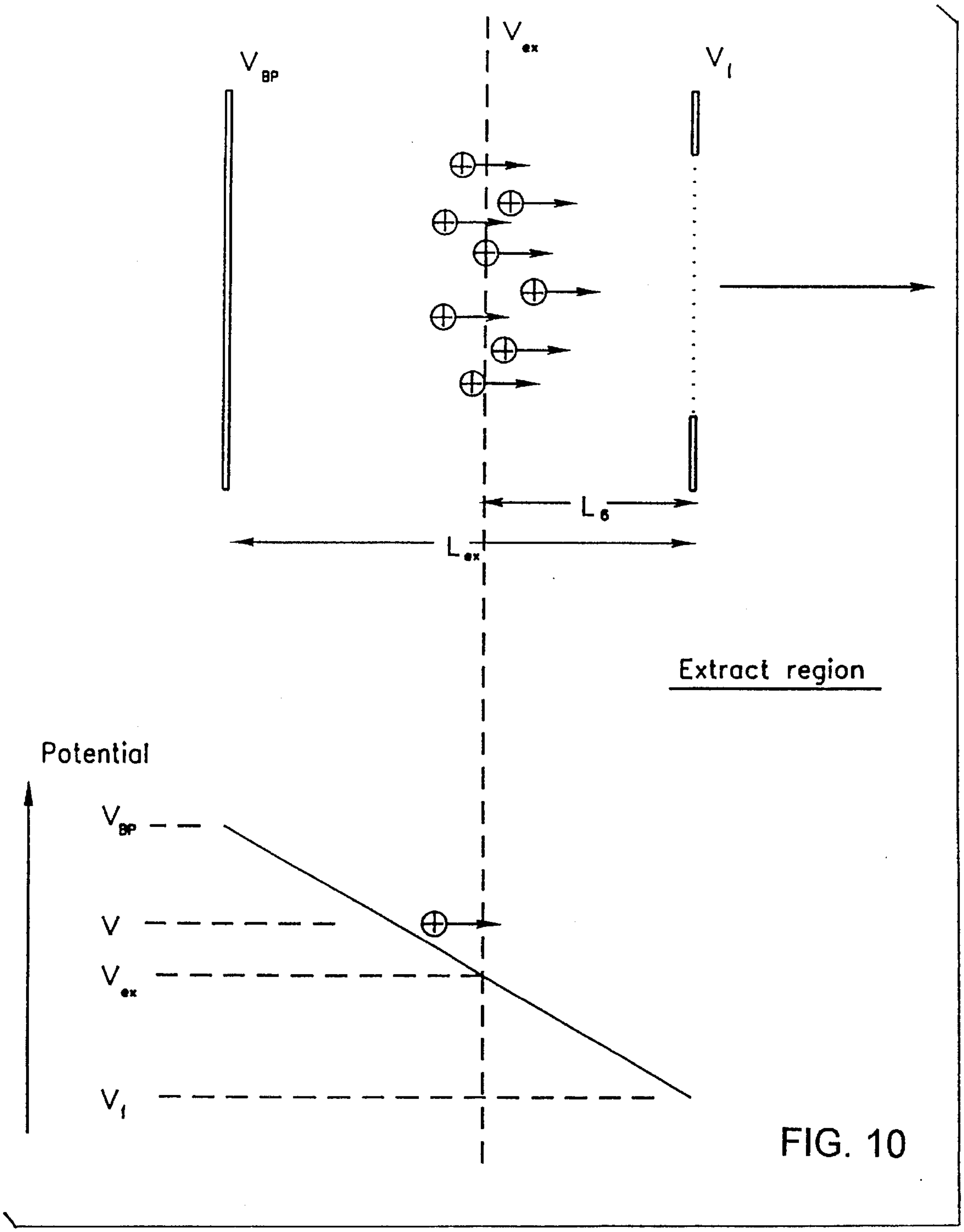
FIG. 10 is a diagram illustrating the problems associated with time-of-flight mass spectrometry and simplified source regions; and, FIG. 11 shows an example of the time-of-flight compensation employed in a further example of the present invention.

FIG. 10 illustrates the problem for a simplified source region where the ion extractor is a planar grid and therefore all the equipotentials are planar and the potential in the source is simply a linear function of position along the flight line. The top half of the figure shows a variety of possible ion positions, centred about a plane at voltage Vex, at the start point of the flight time measurement. The lower half shows the voltage distribution through the source region, where voltages are with reference to the potential of the field free region of the spectrometer. The start time can be defined by either:

(a) the point at which the extracting field is turned on. The source backplate and ion extractor plates would have been at the same voltage at times previous to the start time. At the start time the voltage on one plate or the other is suddenly changed so as to create the potential slope depicted in the figure. or (b) the point at which the ions are created within a static potential slope as depicted. In this case all the ions would have to be created in a short pulse, by, for example, photoionisation due to a pulse of laser light.

Referring to the lower half of FIG. 10, each ion will have a potential energy eV (where e denotes the charge) dependent on the starting position. It is also clear that each ion from different start positions along the flight line will emerge from the extract region with a different velocity and at different times. The exact expressions are given in Appendix A.

Wiley and Maclaren devised an arrangement involving separate extraction and acceleration regions arranged in such a way that the variation in the time taken to emerge from the source, for ions starting at different positions, is largely compensated for by the different velocities that they acquire, providing that the detector is placed in the correct position. An ion that starts nearer the source backplate emerges later than, but catches up with, a less energetic ion that starts nearer the ion extractor plate. Such an arrangement suffers from geometrical constraints, corrects to first order only and is only applicable to gas sources.

Another scheme devised for correction of flight time for different ion energies was devised by Mamyrin et al (Soy. Phys. JETP 37 (1973) p45). An electrostatic reflector is used in part of the ion flight path. More energetic ions, which spend less time traversing the field free regions of the spectrometer, spend more time in the reflector because they penetrate further into the reflecting field. The two opposite effects can be made to approximately cancel out by appropriate design. In the design proposed by Mamyrin the reflector has two regions of different field strength which allows a second order correction to be made to the flight time for variations in ion energy. This method may be applied to both gas sources and to sources where all the ions start from one plane, for example, secondary ions produced by a primary ion beam from a solid sample (SIMS).

It has been suggested that the two methods be combined by using Wiley Maclaren type source for space focusing followed by a Mamyrin stage, optimised so that its source plane lies at the first order time focusing position of the Wiley Maclaren stage. Such a system should be capable of a first order correction, however the 'dual spectrometer' concept is analytically clumsy and misses an opportunity to make a second order correction for different start positions.

The proposal according to the second aspect of the invention disclosed here is to have a time of flight spectrometer that has separate extraction and acceleration stages together with field free regions and a single slope electrostatic reflector, to produce a second order correction of the flight time for starting position within the source. Such a design has the practical advantage that the electrostatic reflector may be of simpler design than the Mamyrin version, having only one slope. A simple example implementation is shown in FIG. 11.

The analysis that gives the theoretical constraints for the distances and voltages required makes no use of the concept of a virtual source, as any such source tends to have only a first order correction associated with it. Instead the flight times in the four regions of the spectrometer (extraction, acceleration, drift, and reflection) are written directly as a function of flight energy, brought about by variation of the starting position, to give a function for the total flight time. The first and second derivatives of this function with respect to the flight energy are then set to zero, by appropriate choice of voltages and dimensions, to produce a second order time focus at the detector.

Figure 11:
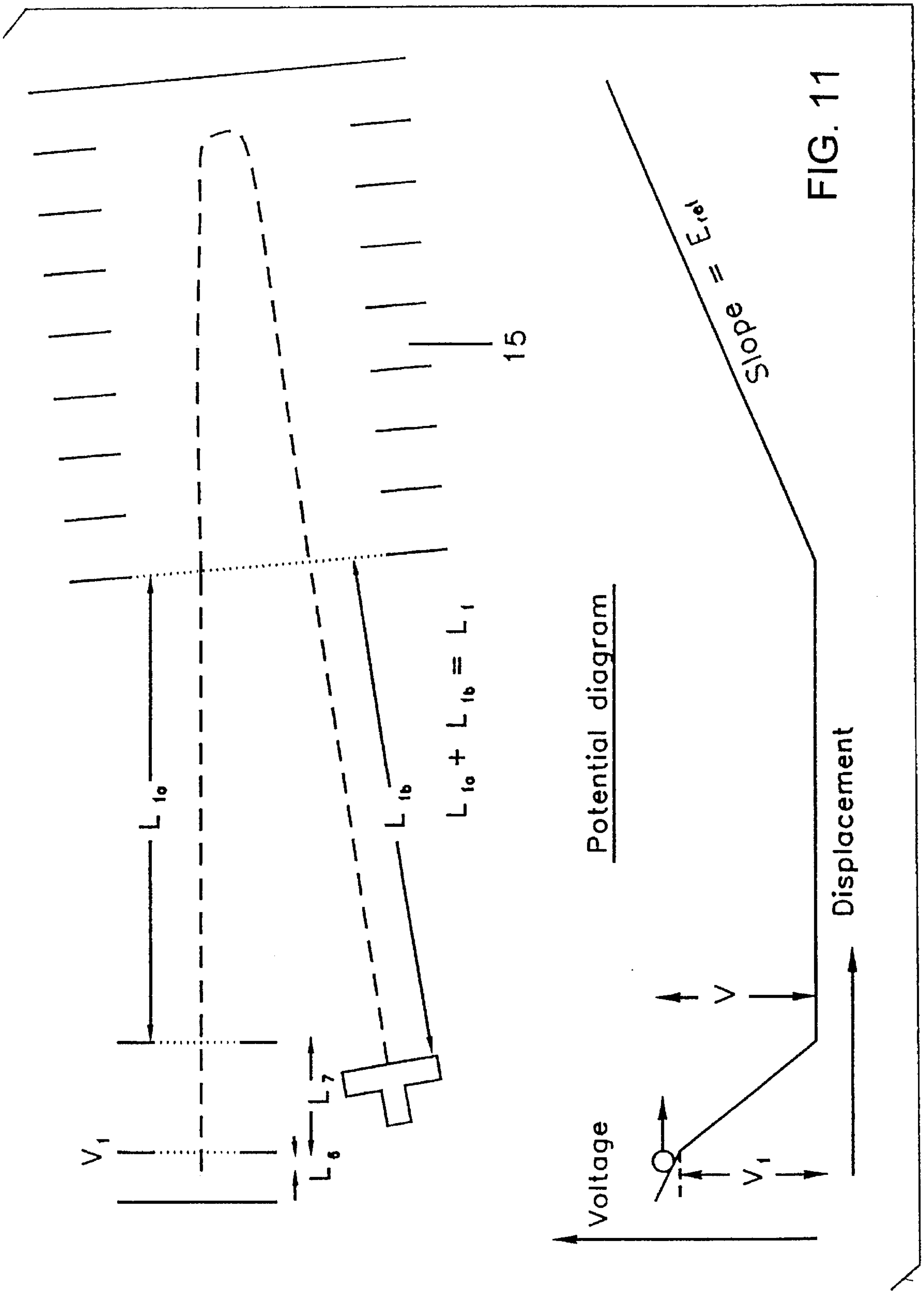

Appendix A gives the mathematical treatment with expressions derived first for the flight times in each of the regions labelled in FIG. 11: the extract region (length $l_6$), the acceleration region (length $l_7$), the drift region (in two parts, total length $l_1$) and the reflect space. Each expression is written as a function of the potential at the ion start position, V (refer also to FIG. 10). To simplify the example the ions are assumed to start with zero velocity. In practice this is often a good approximation and therefore sufficient, however, if there is systematic variation of start velocity with start position, then an allowance may be made for it. Next the total flight time is written as the sum of the time spent in each stage. To minimise the variation of this total time with changing V, the first and second derivatives are taken and set to zero. This gives two equations which can be satisfied providing two of the parameters are adjustable. In practice the physical dimensions are fixed and so two convenient adjustable parameters are the voltage on the ion extractor plate, $V_1$ and the field strength in the electrostatic reflector, $E_{ref}$. An analytical solution of the equations is messy so it is convenient to solve them numerically. Appendix A shows such a solution based on realistic choices for the dimensions and nominal flight energy. Finally a few field strengths, based on the solution, are shown to check that the values are reasonable and there is a plot of the total flight time verses the flight energy of the ion, showing a stationary point at the nominal flight energy.

This time correction scheme would be applicable to any spatially thick source, not Just an electron impact source. Another good example would be a time of flight mass spectrometer where the ions are created by ionisation of neutrals in the gaseous phase by means of a laser beam. The second order focusing would allow good mass resolution for a relatively thick laser beam, which in turn implies a larger range of ion start positions.

APPENDIX A

Refer to figure 11 for physical layout of electrodes and dimensions. Figure 10 shows the extract region in more detail, showing in particualr the different start positions that need to be corrected for.

The charge on each ion is : $e := 1.60217733 \cdot 10^{-19}$
and the mass is given by $m$ One Dalton (a m.u.) is worth $m_1 := 1.6605402 \cdot 10^{-27}$ kg Therefore, for example, a nitrogen molecule $N_2$ has mass : $m := 28 \cdot m_1$

Drift Space

In the simple field free drift space ions have nominal energy $e \cdot V$ and velocity $v$ $$\frac{1}{2} \cdot m \cdot v^2 = e \cdot V \quad \text{and} \quad T_1 = \frac{L_1}{v}$$

Therefore the time spent is given by:

$$T_1 = L_1 \cdot \sqrt{\frac{m}{2 \cdot e \cdot V}} = \frac{L_1}{2} \cdot \sqrt{\frac{2 \cdot m}{e}} \cdot \sqrt{\frac{1}{V}}$$

Reflect space

In the reflect region the time taken is twice the stopping time from velocity: $\sqrt{\frac{2 \cdot e \cdot V}{m}}$ with $a = \frac{e \cdot E_{ref}}{m}$ $$T_2 = \frac{2 \cdot v}{a} = \frac{2 \cdot \sqrt{\frac{2 \cdot e \cdot V}{m}}}{\frac{e \cdot E_{ref}}{m}} = \frac{2}{E_{ref}} \cdot \sqrt{\frac{2 \cdot m}{e}} \cdot \sqrt{V}$$

Extract region

In the source region, ignoring any initial velocity time taken is that to reach exit velocity $\sqrt{\frac{2 \cdot e \cdot (V - V_1)}{m}}$ from a standing start with $a = \frac{e \cdot (V_{ex} - V_1)}{m \cdot L_6}$ $$T_6 = \frac{\sqrt{\frac{2 \cdot e}{m}} \cdot \sqrt{V - V_1}}{\frac{e \cdot (V_{ex} - V_1)}{m \cdot L_6}} = \frac{L_6}{(V_{ex} - V_1)} \cdot \sqrt{\frac{2 \cdot m}{e}} \cdot \sqrt{V - V_1}$$

Time focussed solution

So now let's try and get a numerical solution for sensible lengths and voltages

| Drift | Extract | Accelerate | Nominal energy | |
|---|---|---|---|---|
| $L_1 := 0.33$ | $L_6 := .002$ | $L_7 := .010$ | $V_{ex} := 2000$ | $V := 2000$ |

Guesses: $V_1 := 1800$ $E_{ref} := \frac{5000}{.05}$

*Given*

$$\frac{-1}{4} \cdot L_1 \cdot \sqrt{2} \cdot \frac{\sqrt{m}}{\left[\sqrt{e} \cdot V^{\left(\frac{3}{2}\right)}\right]} + \frac{\sqrt{2}}{\left(\sqrt{e} \cdot \sqrt{V}\right)} \cdot \frac{\sqrt{m}}{E_{ref}} + \frac{1}{2} \cdot \frac{L_6}{\left(V_{ex} - V_1\right)} \cdot \sqrt{2} \cdot \frac{\sqrt{m}}{\left(\sqrt{e} \cdot \sqrt{V - V_1}\right)} \ldots = 0$$
$$+ \frac{L_7}{V_1} \cdot \sqrt{2} \cdot \frac{\sqrt{m}}{\sqrt{e}} \cdot \left[\frac{1}{\left(2 \cdot \sqrt{V}\right)} - \frac{1}{\left(2 \cdot \sqrt{V - V_1}\right)}\right]$$

and $$\frac{3}{8} \cdot L_1 \cdot \sqrt{2} \cdot \frac{\sqrt{m}}{\left[\sqrt{e} \cdot V^{\left(\frac{5}{2}\right)}\right]} - \frac{1}{2} \cdot \frac{\sqrt{2}}{\left[\sqrt{e} \cdot V^{\left(\frac{3}{2}\right)}\right]} \cdot \frac{\sqrt{m}}{E_{ref}} - \frac{1}{4} \cdot \frac{L_6}{\left(V_{ex} - V_1\right)} \cdot \sqrt{2} \cdot \frac{\sqrt{m}}{\left[\sqrt{e} \cdot \left(V - V_1\right)^{\left(\frac{3}{2}\right)}\right]} \ldots = 0$$
$$+ \frac{L_7}{V_1} \cdot \sqrt{2} \cdot \frac{\sqrt{m}}{\sqrt{e}} \cdot \left[\frac{-1}{\left[4 \cdot V^{\left(\frac{3}{2}\right)}\right]} + \frac{1}{\left[4 \cdot \left(V - V_1\right)^{\left(\frac{3}{2}\right)}\right]}\right]$$

$$\begin{pmatrix} V_1 \\ E_{ref} \end{pmatrix} := find\left(V_1, E_{ref}\right)$$

$V_1 = 1813.233$ by numerical soulution of the equations above $E_{ref} = 33339.073$

Acceleration region

In the acceleration region start velocity is given, as before, by : $\sqrt{\frac{2\cdot e\cdot(V-V_1)}{m}}$ and the exit velocity is: $\sqrt{\frac{2\cdot e\cdot V}{m}}$ with acceleration $\frac{e\cdot V_1}{m\cdot L_7}$ therefore the time is:

$$T_7=\frac{\sqrt{\frac{2\cdot e\cdot V}{m}}-\sqrt{\frac{2\cdot e\cdot(V-V_1)}{m}}}{\frac{e\cdot V_1}{m\cdot L_7}}=\frac{L_7}{V_1}\cdot\sqrt{\frac{2\cdot m}{e}}\cdot\left(\sqrt{V}-\sqrt{V-V_1}\right)$$

Total flight times total flight time is given by the sum $$\left[\frac{L_1}{2}\cdot\sqrt{\frac{2\cdot m}{e}}\cdot\sqrt{\frac{1}{V}}+\frac{2}{E_{ref}}\cdot\sqrt{\frac{2\cdot m}{e}}\cdot\sqrt{V}+\frac{L_6}{(V_{ex}-V_1)}\cdot\sqrt{\frac{2\cdot m}{e}}\cdot\sqrt{V-V_1}\right]+\frac{L_7}{V_1}\cdot\sqrt{\frac{2\cdot m}{e}}\cdot\left(\sqrt{V}-\sqrt{V-V_1}\right)$$

The first derivative of the total time w.r.t. the flight energy gained by starting from different points within the source is:

$$\frac{-1}{4}\cdot L_1\cdot\sqrt{2}\cdot\frac{\sqrt{m}}{\left[\sqrt{e}\cdot V^{\left(\frac{3}{2}\right)}\right]}+\frac{\sqrt{2}}{\left(\sqrt{e}\cdot\sqrt{V}\right)}\cdot\frac{\sqrt{m}}{E_{ref}}+\frac{1}{2}\cdot\frac{L_6}{(V_{ex}-V_1)}\cdot\sqrt{2}\cdot\frac{\sqrt{m}}{\left(\sqrt{e}\cdot\sqrt{V-V_1}\right)}\ \ldots$$
$$+\frac{L_7}{V_1}\cdot\sqrt{2}\cdot\frac{\sqrt{m}}{\sqrt{e}}\cdot\left[\frac{1}{\left(2\cdot\sqrt{V}\right)}-\frac{1}{\left(2\cdot\sqrt{V-V_1}\right)}\right]$$

and the second derivative is:

$$\frac{3}{8}\cdot L_1\cdot\sqrt{2}\cdot\frac{\sqrt{m}}{\left[\sqrt{e}\cdot V^{\left(\frac{5}{2}\right)}\right]}-\frac{1}{2}\cdot\frac{\sqrt{2}}{\left[\sqrt{e}\cdot V^{\left(\frac{3}{2}\right)}\right]}\cdot\frac{\sqrt{m}}{E_{ref}}-\frac{1}{4}\cdot\frac{L_6}{(V_{ex}-V_1)}\cdot\sqrt{2}\cdot\frac{\sqrt{m}}{\left[\sqrt{e}\cdot(V-V_1)^{\left(\frac{3}{2}\right)}\right]}\ \ldots$$
$$+\frac{L_7}{V_1}\cdot\sqrt{2}\cdot\frac{\sqrt{m}}{\sqrt{e}}\cdot\left[\frac{-1}{\left[4\cdot V^{\left(\frac{3}{2}\right)}\right]}+\frac{1}{\left[4\cdot(V-V_1)^{\left(\frac{3}{2}\right)}\right]}\right]$$

Implications

Field strength in extract region is $E_6 := \frac{V_{ex} - V_1}{L_6 \cdot 1000}$ $E_6 = 93.383$ V/mm the length of reflectron actually used is $\frac{V}{E_{ref}} \cdot 1000 = 59.99$ mm and the field strengths in extract region $\frac{V_{ex} - V_1}{L_6 \cdot 1000} = 93.383$ V/mm and acceleration region $\frac{V_1}{L_7 \cdot 1000} = 181.323$ V/mm If the spacing between the source backplate and the ion extractor electrode is $L_{ex} := .005$ (see figure 10)

then the extraction pulse required can be derived from : $V_p := \frac{L_{ex}}{L_6} \cdot (V_{ex} - V_1)$
as the field is linear.

for the numrical example $V_p = 467$ V

The total time is given by:

$$T_t(V) := \frac{L_1}{2} \cdot \sqrt{\frac{2 \cdot m}{e}} \cdot \sqrt{\frac{1}{V}} + \frac{2}{E_{ref}} \cdot \sqrt{\frac{2 \cdot m}{e}} \cdot \sqrt{V} + \frac{L_6}{(V_{ex} - V_1)} \cdot \sqrt{\frac{2 \cdot m}{e}} \cdot \sqrt{V - V_1} \ldots$$
$$+ \frac{L_7}{V_1} \cdot \sqrt{\frac{2 \cdot m}{e}} \cdot \left(\sqrt{V} - \sqrt{V - V_1}\right)$$

Nominal total flight time is : $T_t(V) = 5.097 \cdot 10^{-6}$ $v := \sqrt{\frac{2 \cdot e \cdot V}{m}}$ So effective path length is given by : $T_t(V) \cdot v = 0.598$ $points := 50$ $V_{min} := V_{ex} - (V_{ex} - V_1) \cdot \frac{.001}{L_6}$ $V_{max} := V_{ex} + (V_{ex} - V_1) \cdot \frac{.001}{L_6}$ $V_{step} := \frac{V_{max} - V_{min}}{points}$ $V := V_{min}, (V_{min} + V_{step}) .. V_{max}$

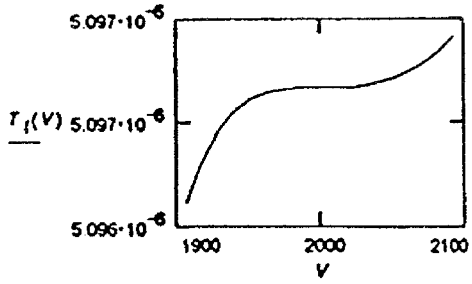

$j := 1, 2 .. points + 1 \qquad k := 1, 2 .. points$ $t_j := T_t\left[V_{min} + V_{step} \cdot (j - 1)\right]$ A set of time values to base a simulated peak on. Assumes even population through energy range.

$$int_j := T_t(V_{min}) + (j - 1) \cdot \frac{T_t(V_{max}) - T_t(V_{min})}{points}$$

$peak := hist(int, t)$

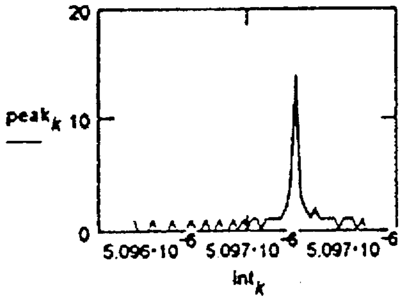

Calculated resolution by method 1

$t_{res} := \frac{1}{2.35} \cdot \frac{mean(t)}{stdev(t)}$ mass resolution is : $m_{res} := \frac{t_{res}}{2}$ $\qquad m_{res} = 6697.881$ Calculated resolution by method 2 half peak height $h := \frac{max(peak)}{2}$ $\qquad k := 1, 2 .. points - 1$ $V_k := until\left[-\left[\left(peak_k \le h\right) \cdot \left(peak_{k+1} \ge h\right)\right], k\right] \qquad n := last(V) \qquad n = 34$ $$T_{low} := if\left[peak_n = peak_{n+1}, int_n + \left(int_{n+1} - int_n\right) \cdot \frac{h - peak_n}{peak_{n+1} - peak_n}, int_n\right]$$

$T_{low} = 5.097 \cdot 10^{-6}$ $V_k := until\left[-\left[\left(peak_k \ge h\right) \cdot \left(peak_{k+1} \le h\right)\right], k\right] \qquad n := last(V) \qquad n = 35$ $$T_{high} := if\left[peak_n = peak_{n+1}, int_n + \left(int_{n+1} - int_n\right) \cdot \frac{h - peak_n}{peak_{n+1} - peak_n}, int_n\right]$$

$T_{high} = 5.097 \cdot 10^{-6}$ $$T_{res} := \frac{T_{high}}{T_{high} - T_{low}} \qquad M_{res} := \frac{T_{res}}{2} \qquad M_{res} = 1.187 \cdot 10^5$$

I claim:

1. An ion gun comprising:

an at least part annular ion source, the source arranged such that ions are extracted from around the source in a direction perpendicular to the plane of the source; and directing means adapted to direct, said ions towards a location that lies on the central axis perpendicular to the plane of the source.

2. A mass spectrometer comprising:

an ion gun according to claim 1; and an ion detector positioned substantially on the central axis.

3. A mass spectrometer according to claim 2, wherein the directing means is a series of ring-type electrodes which direct said ions towards the point on the central axis.

4. A mass spectrometer according to claim 2, further comprising a circular aperture located on the central axis adjacent to the position at which the ion trajectories cross said central axis.

5. A mass spectrometer according to claim 4, further comprising a central hole in the source through which said ions are directed.

6. A mass spectrometer according to claim 2, further comprising an electrostatic reflecting element.

7. A mass spectrometer according to claim 6, wherein said ion detector is disposed on the opposite side of the source to the electrostatic reflector.

8. A mass spectrometer according to claim 6, further comprising an electrostatic lens which focuses pulses of said ions from the ion gun onto a sample, so that secondary ions sputtered from the sample surface are directed back via the electrostatic reflecting element to the ion detector and secondary ion mass spectrometry performed.

9. A mass spectrometer according to claim 2, further comprising one or more circular filaments placed adjacent to the source region.

10. A mass spectrometer according to claim 2, further including means for injecting neutral gas into the source substantially perpendicularly to the direction in which said ions are emitted from the source.

11. A mass spectrometer according to claim 10, further comprising a pump placed opposite the gas injecting means.

12. A mass spectrometer according to claim 2, further comprising means for introducing positive or negative ions into the source that have been created externally.

13. A mass spectrometer according to claim 2, wherein the source is adapted to store said ions prior to their extraction.

14. A mass spectrometer according to claim 13, further comprising means for injecting neutrals tangentially to a circle defined by the source, so that, on becoming ionised, the neutrals follow the line of the source and are stored within the source.

15. A mass spectrometer according to claim 13, wherein the means for storing said ions in the source is provided by a source of a high space charge of electrons which directs the ions around the source.

16. A mass spectrometer according to claim 13, wherein the means for storing said ions in the source is a circular guide wire that is maintained at voltage that attracts the ions.

17. A mass spectrometer according to claim 13, wherein the means for storing said ions is a series of rings immediately surrounding the source region which have an RF quadrupole electric field applied to them.

18. A mass spectrometer according to claim 13, wherein the means for storing said ions in the source is a cylindrical or toroidal electrode which provides a weak electrostatic field within the source region.

19. A mass spectrometer according to claim 2, comprising a time of flight mass spectrometer and further including:

an accelerating region into which said annular ion source accelerates said ions, said ion source accelerating said ions electrostatically by means of a first electrostatic field; said accelerating region having a further electrostatic field;

at least one field free flight region;

an electrostatic reflector; and a detector, the regions of flight path being capable of adjustment in terms of length or field strength in such a way that the total flight times of said ions from different initial start positions on a line parallel to the extraction field are independent of the position of the starting point.

20. A time of flight mass spectrometer comprising:

an ion gun including an at least part annular ion source having a central axis, the source arranged such that ions are extracted from around the source in a direction perpendicular to the plane of the source, and directing means adapted to direct said ions towards the location that lies in the central axis of the source the ion gun produces a source region having a first electrostatic extraction field that accelerates said ions into an accelerating region having a second electrostatic field, and at least one field free flight region;

an ion detector positioned substantially on the central axis of the source; and an electrostatic reflector on said central axis for directing said ions from the source to the detector, the regions of flight path being capable of adjustment in terms of length or field strength in such a way that the total flight times of said ions from different initial start positions on a line parallel to the extraction field are independent of the position of the starting point.

* * * * *